United States Patent [19]
Roberts et al.
[11] 3,872,493
[45] Mar. 18, 1975

[54] SELECTIVE IRRADIATION OF JUNCTIONED SEMICONDUCTOR DEVICES

[75] Inventors: John S. Roberts, Export; Michael W. Cresswell, Pittsburgh, both of Pa.

[73] Assignee: Westinghouse Electric Corporation, Pittsburgh, Pa.

[22] Filed: Aug. 25, 1972

[21] Appl. No.: 283,684

[52] U.S. Cl. .................................... 357/29, 357/38
[51] Int. Cl. ........................ H01l 11/10, H01l 15/00
[58] Field of Search .. 317/235 N, 235 AB, 235 AG, 317/235 AY; 148/1.5

[56] References Cited

UNITED STATES PATENTS

| | | | |
|---|---|---|---|
| 3,366,793 | 1/1968 | Svedberg | 250/211 |
| 3,422,323 | 1/1969 | Whoriskey | 317/235 |
| 3,442,722 | 5/1969 | Bauerlein | 148/178 |
| 3,532,910 | 10/1970 | Lee et al. | 317/234 |
| 3,564,357 | 2/1971 | Valcik | 317/235 |

*Primary Examiner*—Martin H. Edlow
*Attorney, Agent, or Firm*—C. L. Menzemer

[57] ABSTRACT

Semiconductor devices such as silicon thyristors are provided with increased blocking voltage without significantly increasing the forward voltage drop of the device. Bulk portions of the device are masked against radiation, such as an electron radiation, and peripheral portions of the device are irradiated with suitable radiation such as electron radiation.

6 Claims, 5 Drawing Figures

SELECTIVE IRRADIATION OF JUNCTIONED SEMICONDUCTOR DEVICES

FIELD OF THE INVENTION

The present invention relates to the manufacture of semiconductor devices and particularly high power semiconductor devices utilizing PN blocking junctions.

BACKGROUND OF THE INVENTION

In making junctioned semiconductor devices, many units fail to meet the blocking voltage rating for which they are designed. This failure is particularly pronounced in high power devices with blocking voltages of 1,400 volts and higher. It is not unusual with such power devices to have quantative yields below 50 percent. The devices which are rejected are only of marginal commercial value; some may have electrical characteristics that make them usable in some alternative applications, but such secondary uses usually result in a compromise of the electrical characteristics appropriate for the secondary use.

The rated blocking voltage is usually classified by the voltage the device can withstand without exceeding a specified leakage current (e.g., 13 ma) at a specified temperature (e.g., 125°C.). The problem of raising quantative yields thus centers on reducing the leakage current for the blocking PN junction of the device as a function of the applied voltage.

High leakage currents have been known to originate because of localized avalanching at the junction-surface intercept of the device. This localized avalanching results from localized high electric fields which are believed to be caused by surface charge and/or damage to the atomic lattice in the surface region. Generally, this effect is reduced (i) by forming a recess in the internal portion of the device so that the reach-through voltage at the recess is much lower than the avalanche voltage of the junction and/or (ii) by beveling the surface of the device at the junction intercept so that the carrier depletion region at the intercept is redistributed and in turn the attendant electric fields are not greater than in the bulk of the device. These steps lower the probability of localized avalanche and current leakage, but they do not provide viable commerical means of reclaiming prepared devices which have been found not to meet specifications.

Another proposal is to over design the semiconductor device. For example, a thyristor for which a blocking voltage of 2,000 volts was desired would be designed, for example, for 2,600 volts so that an added margin of safety was supplied. The problem with the proposal is that generally the bulk resistance of the device is also increased which in turn increases the forward voltage drop.

It has been suggested to irradiate semiconductor devices for various reasons. For example, it has been described in patent application Ser. No. 324,718 filed Jan. 18, 1973 (assigned to the same assignee as the present application) to "bulk" irradiate fast switching thyristors to decrease the turn-off time. However, it has not been suggested that irradiation could be used to maximize yields of devices as in the present invention. Indeed, irradiation has been known to raise the forward voltage drop beyond tolerable limits while raising blocking voltage. Irradiation has therefore been rejected as a viable solution to the problem of reclaiming rejected devices because of failure to meet accompanying forward voltage drop requirements.

The present invention goes against prior understandings and utilizes irradiation to overcome the observed difficulties and disadvantages in the making of junctioned semiconductor devices with high blocking voltage ratings. It provides a relatively inexpensive way of increasing the blocking voltage without jeopardizing the conducting properties of the semiconductor device. It also provides a relatively inexpensive way of reclaiming prepared devices which would otherwise be rejected for failure to meet a specified voltage rating.

SUMMARY OF THE INVENTION

The present invention provides semiconductor devices such as silicon thyristors in which the blocking voltage is increase without significantly increasing the forward voltage drop of the device. The device is irradiated by masking the bulk portions of the device against radiation from a radiation source and thereafter irradiating peripheral portions of the device.

Electron radiation is preferably used as a radiation source because of availability and inexpensiveness. However, it is contemplated that any kind of radiation such as proton, neutron, alpha and gamma radiation may be appropriate, provided it is capable of bombarding and disturbing the atomic lattice to create energy levels substantially increasing the recombination rate of the carriers without correspondingly increasing the carrier generation rate.

Further, it is preferred that a radiation level of the electron radiation greater than 1 Mev be used to irradiate silicon semiconductor devices. Lower level radiation is generally believed to result in substantial elastic collisions with the atomic lattice and therefore does not provide enough damage to the lattice in commercially feasible time periods. Moreover, such lower level radiation results in substantial electron scatter into the masked, bulk portion of the device, which is detrimental to maintenance of the forward voltage drop across the silicon device in its conducting state. From a practical view, it has therefore been found that radiation levels between 1 to 10 Mev and most desirably 2 Mev are preferred with available radiation equipment.

To provide appropriate radiation, it has been found that radiation exposures above $1 \times 10^{13}$ electrons/cm$^2$ are preferred in silicon semiconductor devices with 2 Mev radiation. Lower values have not been found to provide substantial increases in blocking voltages of high voltage devices. Preferably, the radiation exposure, also, does not exceed $1 \times 10^{15}$ electrons/cm$^2$ to avoid the radiation from extending into the masked, bulk portion of the silicon device and result in significant increases in forward voltage drop.

Because of the mechanism believed to be involved, it is believed that the invention has special utility with gated semiconductor devices such as transistors and thyristors. The leakage current has been found to originate primarily from the peripheral portion of the semiconductor device. It is presently concluded from experimental observations that irradiation of the peripheral portion drastically reduces amplification of the leakage current generated in the peripheral portion of the carrier depletion region in the blocking mode. The mechanism is believed to be the lowering of carrier lifetime through the introduction of radiation-induced lattice defects which serve as electron-hole recombination centers. If this mechanism is correct, the invention does not have affect to improve the blocking voltage of devices such as rectifiers where gain is not involved.

Further, the invention has been found to have particular application with silicon thyristors designed for blocking voltages in excess of 1,600 volts. The invention has been applied with pronounced increase in blocking voltage to certain thyristors with lower voltages; however, it has also been found to provide no substantial improvement in other lower voltage devices of certain compositions.

Other details, objects and advantages of the invention will become apparent as the following description of the present preferred embodiment and present preferred methods of practicing the same proceeds.

BRIEF DESCRIPTION OF THE DRAWINGS

In the accompanying drawings, the present preferred embodiment of the invention and present preferred methods of practicing the invention are illustrated in which.

DESCRIPTION OF THE PREFERRED EMBODIMENTS

Figure 1:
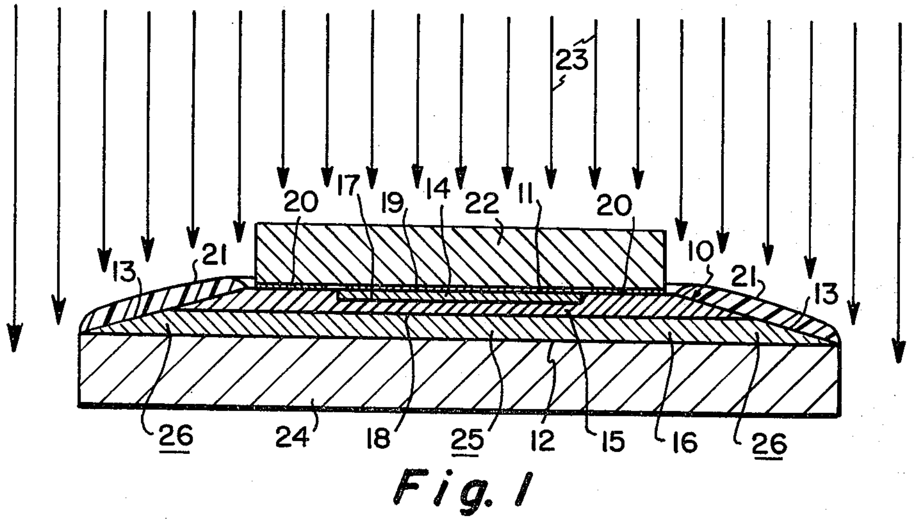
FIG. 1 is an elevational view in cross-section of a transistor being irradiated in accordance with the present invention.

Referring to FIG. 1, a silicon transistor wafer or body 10 is shown having opposed major surfaces 11 and 12 and curvilinear side surfaces 13. The transistor wafer 10 has emitter and collector regions 14 and 16, respectively, of one conductivity type of impurity adjoining major surfaces 11 and 12, respectively, and base region 15 of the opposite conductivity type of impurity in the interior of the wafer between the emitter and collector regions. Two PN junctions 17 and 18 are present, junction 17 at the transistion between regions 14 and 15, and junction 18 at the transistion between regions 15 and 16. Junction 18 is reversed biased in normal transistor operation.

To complete the transistor, metal contacts 19 and 20 make ohmic contacts to emitter and base regions 14 and 15, respectively, at major surface 11, and metal substrate 24 makes ohmic contact to collector region 16 at major surface 12. Atmospheric effects on transistor operation are substantially reduced by coating side surfaces 13 with a suitable passivating resin such as a silicone or epoxy composition.

Selective irradiation is performed on wafer 10 by masking bulk portions 25 of wafer 10 with circular shield plate 22 and annularly irradiating peripheral portions 26 of wafter 10 with 2 Mev electron radiation 23. Shield plate 22 may be of any material of sufficient density and thickness to be opaque to the particular radiation used. For electron radiation the shield plate may be standard low carbon steel or tungsten of about 5/32 inch thickness. Shield plate 22 may be positioned by simply overlaying on contacts 19 and 20 to cover the bulk portion of the device. After irradiation is completed, shield plate 22 is physically removed for reuse in subsequent irradiation.

Figure 2:
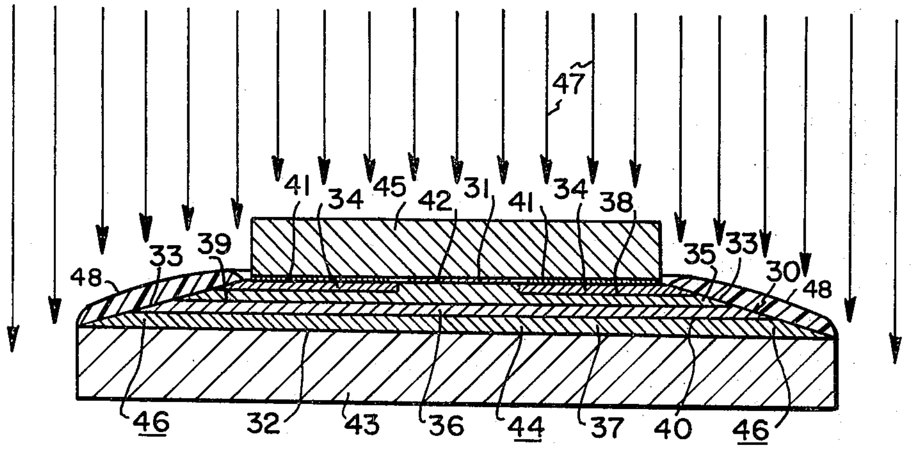
FIG. 2 is an elevational view in cross-section of a thyristor being irradiated in accordance with the present invention.

Referring to FIG. 2, a silicon thyristor wafer or body 30 of 2,000 volt reverse blocking capacity is shown having opposed major surfaces 31 and 32 and curvilinear side surface 33. The thyristor wafer 30 has cathode-emitter region 34 and anode-emitter region 37 of opposite conductivity type of impurity adjoining major surfaces 31 and 32, respectively, and cathode-base region 35 and anode-base region 36 of opposite conductivity type of impurity in the interior of the wafer between emitter regions 34 and 37. The cathode-emitter region 34 and cathode-base region 35 are also of opposite conductivity type of impurity as is anode-base region 36 and anode-emitter region 37. By this arrangement, tyristor wafer 30 is provided with a four layer impurity structure in which three PN junctions 38, 39 and 40 are provided.

The thyristor is provided with a center fired gate by adjoining cathode-base region 35 to the major surface 31 at center portions of the wafer. Cathode-emitter region 34 thus extends around surface portions of region 35. To provided electrical connections to the tyristor wafer, metal contacts 41 and 42 make ohmic contact to cathode-emitter region 34 and cathode-base region 35, respectively, at major surface 31, and metal substrate 43 makes ohmic contact to anode-emitter region 37 at major surface 32. Atmospheric effects on the thyristor operation are substantially reduced by coating side surfaces 33 with a suitable passivating resin such as a silicone or epoxy composition.

Selective irradiation is performed on wafer 30 by masking bulk portions 44 of wafer 30 with circular shield plate 45 and annularly irradiating peripheral portions 46 of wafer 30 with 2 Mev electron radiation 47. Shield plate 45 is positioned by simply overlaying in contact with metal contacts 41 and 42. Plate 45 is of the same density and thickness as previously presecribed for shield plate 22.

By the irradiation shown in both FIGS. 1 and 2, the blocking voltage of the device is typically increased 300 to 400 volts on an exposure of $2.5 \times 10^{13}$ electrons/cm$^2$ without significantly increasing the forward voltage drop of the device. This increased performance has been attributed to suppression of the amplification of leakage current generated in the carrier depletion region on application of reverse bias voltage.

Figure 3:
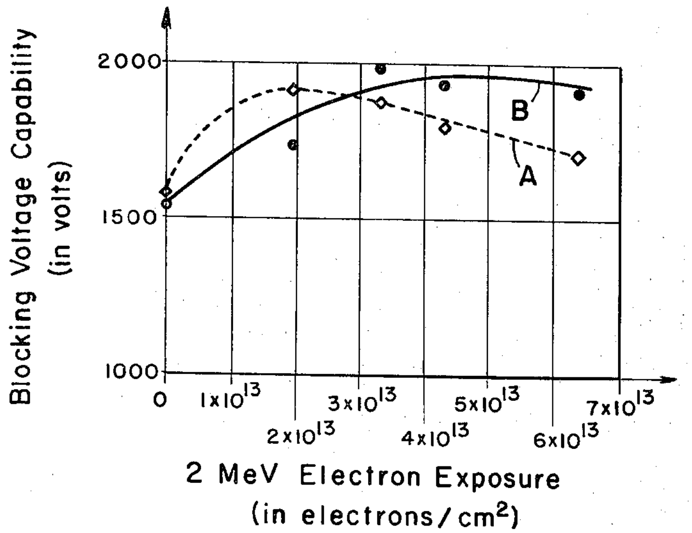
FIG. 3 is a graph showing the change with irradiation of reverse and forward blocking voltage capability of thyristors similar to that shown in FIG. 2.

Example of the observed increase in blocking voltage while maintaining the conducting properties is shown in FIG. 3. The reverse and forward blocking voltages of rejected thyristors of design voltage of 2,000 volts, similar to that shown in FIG. 2, were measured after selective irradiation of their peripheral portions with 2 Mev electron radiation for different exposures. Curve A shows the change in reverse blocing voltage of the thyristors with varying exposure levels; and Curve B shows the change in forward blocking voltage of the same thyristors with varying exposure levels. Each point on the curves is an average of 20 readings. As shown, it is preferable for greastest increase in reverse blocking voltage, while not significantly increasing the forward conducting voltage, that the exposure level be maintained at about 2 × $10^{13}$ electrons/cm$^2$.

To better understand the results shown in FIG. 3, consider equivalent devices in parallel with one having the electrical characteristics of the bulk portion of the thyristor of FIG. 2 and the other having the electrical characteristics of the peripheral portion. In the blocking mode, the total leakage current can be written:

$$I_L = [I_{CBO}(P)/(1-\alpha^{(P)})]\ [I_{CBO}(B)/(1-\alpha^{(B)})] \qquad (I)$$

where $I_{CBO}$ (*P*) is the satruation current of the peripheral portion;

$I_{CBO}$ (*B*) is the saturation current of the bulk portion;

$\alpha^{(P)}$ is the gain of the peripheral portion; and $\alpha^{(B)}$ is the gain of the bulk portion.

The greater part of the total leakage current at 125°C originates from the first term. This finding is consistent with the observation that the effective blocking capability of the fully processed device is very sensitive to the quality of the bevel lapping, spin etch, and passivation operations performed on the contoured surface.

It follows that a part of the problem of current leakage is with the $\alpha^{(P)}$ gain. The reasoning develops that if the $1/(1-\alpha^{(P)})$ amplification factor is essentially destroyed without significant degradation to the $\alpha^{(B)}$ gain, the leaking current could be reduced. Equation I thus reduces to:

$$I_L \approx I_{CBO}(P) + [I_{CBO}(B)/(1-\alpha^{(B)})] \qquad (II)$$

A comparison of Equation I and II suggests that destruction of $\alpha^{(P)}$ substantially reduces the leakage current.

In accord, experimental observations show that the total current leakage is substantially reduced by peripheral irradiation. The gain $\alpha^{(B)}$ is not significantly affected by such irradiation. The mechanism is believed to be that the nature to the defects produced by bombarding electrons increases carrier recombination rates in the peripheral portion thus substantially reducing the carrier lifetimes. The radiation does to some degree also increase the carrier generation rate in the carrier depletion regions ($I_{CBO}$), but the change in recombination rate overrides the carrier generation rate change. The lifetime reducing qualities of the radiation are kept from affecting the $\alpha^{(B)}$ gain by the masking shield plate.

The merits of the invention were further established by irradiating a group of thyristors with and without selective masking of the peripheral portion. The thyristor wafers were 1.28 inches in diameter with a cathode-emitter region, because of the beveled side surfaces, of 1.08 inches in diameter. The shield plate used to selectively mask the thyristors was a tungsten slug of about ⅞ inch diameter and about 5/32 inch thickness. All thyristors were irradiated with a 2 Mev electron beam to the exposure shown in the tables below. The illustrative results of test runs with unmasked irradiation are shown in Table I, and directly comparable test runs are shown in Table II.

TABLE I

| Run No. | Electron Exposure in electrons/cm² 0 | 1.96 × 10¹³ | 3.36 × 10¹³ |
|---|---|---|---|
| 1 | 1700 (1) | 2200 | 2200 |
| | 1.39 (2) | 2.38 | > 3.5 |
| 2 | 1300 | 1600 | 1600 |
| | 1.34 | 2.17 | > 3.5 |
| 3 | 1000 | 2000 | 2000 |
| | 1.41 | 2.66 | > 3.5 |
| 4 | 1200 | 1700 | 1700 |
| | 1.38 | 2.17 | > 3.5 |
| 5 | 1200 | 1900 | 1800 |
| | 1.38 | 2.29 | > 3.5 |

(1) The first number is the forward blocking voltage in volts measured at 125°C and 13 milliamps.
(2) The second number is the forward voltage drop in volts measured at room temperature and 625 amps.

TABLE II

| Run No. | Electron Exposure in electrons/cm² 0 | 9.0 × 10¹² | 1.9 × 10¹³ |
|---|---|---|---|
| 1 | 500 | 800 | 900 |
| | 1.15 | 1.22 | 1.28 |
| 2 | 1000 | 1150 | 1200 |
| | 1.19 | 1.26 | 1.35 |
| 3 | 800 | 1180 | 1200 |
| | 1.40 | 1.57 | 1.62 |
| 4 | 1000 | 1625 | 1600 |
| | 1.32 | 1.42 | 1.53 |
| 5 | 740 (1) | 1000 | 1100 |
| | 1.18 (2) | 1.41 | 1.69 |
| 6 | 740 | 1000 | 1000 |
| | 1.18 | 1.40 | 1.72 |
| 7 | 1250 | 1325 | 1400 |
| | 1.33 | 1.82 | too high to read |
| 8 | 1300 | 1875 | 2000 |
| | 1.39 | 1.88 | too high to read |

(1) The first number is the forward blocking voltage in volts measured at 125°C and 13 milliamps.
(2) The second number is the forward voltage drop in volts measured at room temperature and 625 amps.

As shown by Table I and by the last four runs of Table II unmasked, bulk irradiation of the thyristors resulted in unmarketable devices. The upper limit for forward voltage drop and still provide marketability of such devices is about 1.80 volts. Conversely, runs 1 through 4 of Table II show that selective irradiation of the peripheral portion of the thyristors resulted in devices having markedly higher forward blocking voltage while maintaining the forward voltage drop within nominal values.

Figure 4:
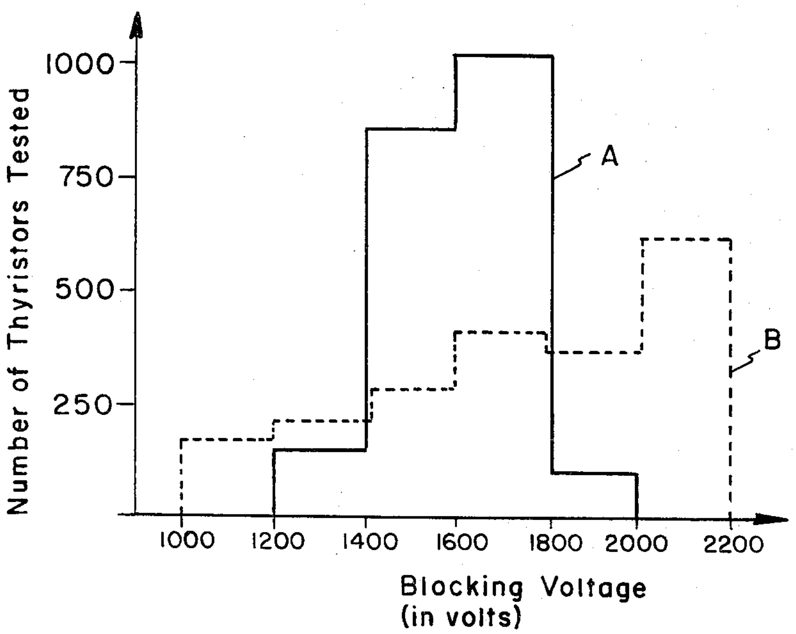
FIG. 4 is a graph showing the statistical distribution of the lower of the reverse and forward blocking voltages before and after irradiation of thyristors similar to that shown in FIG. 2.
Figure 5:
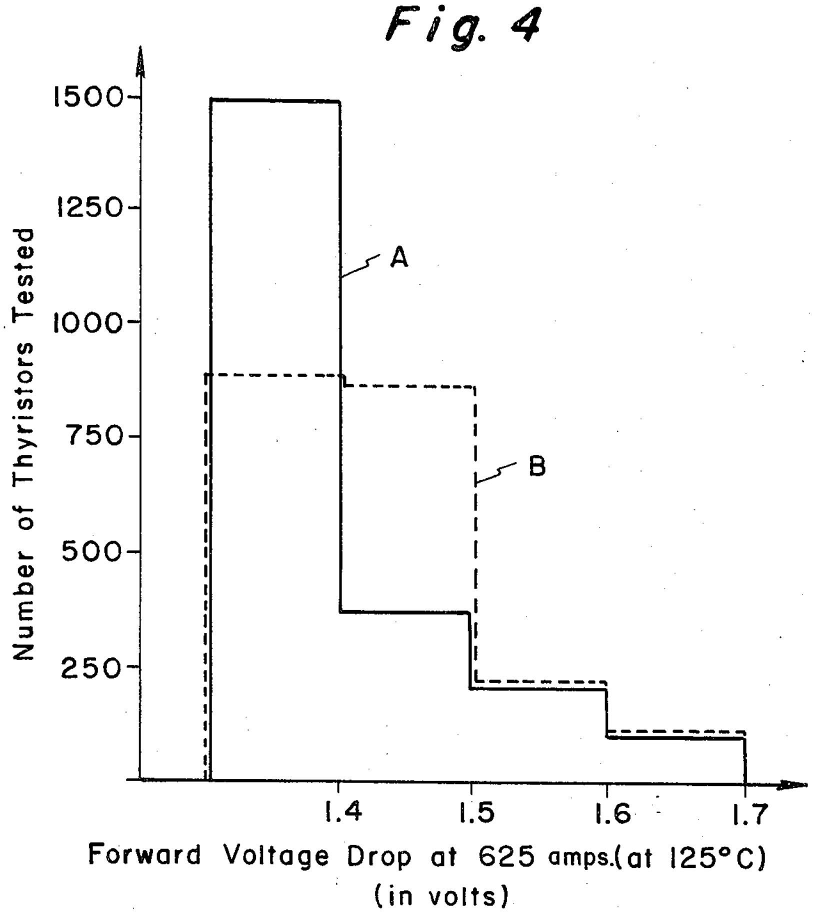
FIG. 5 is a graph showing the statistical distribution of forward voltage drop before and after irradiation of the thyristors tested in connection with FIG. 4.

To further illustrate the invention, the lower of forward and reverse voltage in the blocking mode and forward voltage drop in the conducting mode were measured on a group of 2,000 thyristors similar to FIG. 2. Measurements were made on the thyristor which had a 2,000 volt designed blocking capacity before and after irradiation to 2.5 × $10^{13}$ electron/cm$^2$ with an electron beam of 2 Mev. The results are shown in FIGS. 4 and 5. Curves A of FIGS. 4 and 5 show the blocking voltage and forward voltage drop distributions before irradiation, and Curves B of FIGS. 4 and 5 show the blocking voltage and forward voltage drop distributions after irradiation.

FIGS. 4 and 5 show that the 2,000 volt thyristors tested had relatively low marketability before irradiation. Their forward voltage drop varied between 1.4 and 1.7 volts at 625 amps and 25°C, and their blocking voltages were all below 1,800 volts for the specified limit for current leakage. After selective irradiation of the peripheral portion, a substantial number of the thyristors tested out with a 2,000 volt blocking voltage within permissible current leakage limits while, maintaining acceptable forward voltage drops between 1.5 and 1.7 volts at 625 amps and 125°C.

The commercial importance of substantially increasing the quantative yield of 2,000 volt devices cannot be overemphasized. The substandard devices would be of low commerical worth.

Having established the quantative merits of the invention, experiments were perfomed to determine the quantative nature of the invention. A group of 100 thyristors having a blocking voltage between 1,600 and 1,800 volts and nominal forward voltage drops at 625 amps and 125°C. (i.e., between 1.5 and 1.7 volts) were tested with different size radiation shields. The wafers were 1.28 inches in diameter with a cathode-emitter region, because of the beveled side surfaces, of 1.08 inches in diameter. The thyristors were divided into four equal-sized groups. The first and second groups were tested with a shield plate of 15/16 inch diameter low carbon steel, and the third and fourth groups were tested with a shield plate of ⅞ inch diameter low carbon steel. The first and third groups were irradiated to $2.08 \times 10^{13}$ electrons/cm², and the second and fourth group were irradiated to $3.2 \times 10^{13}$ electrons/cm². The results are detailed in Table III below in terms of the average increase in $V_{BO}$ and $V_R$ ratings at 125°C and the average increases in forward voltage drops at 25°C.

TABLE III

| | Group I | Group II | Group III | Group IV |
|---|---|---|---|---|
| Shield Diameter (in inches) | 15/16 | 15/16 | ⅞ | ⅞ |
| Radiation Exposure (in electrons/cm²) | $2.08 \times 10^{13}$ | $3.2 \times 10^{13}$ | $2.08 \times 10^{13}$ | $3.2 \times 10^{13}$ |
| Average Increase in Forward Blocking Voltage ($V_{BO}$) at 125°C (in volts) | 360 | 500 | 440 | 440 |
| Average Increase in Reverse Blocking Voltage ($V_R$) at 125°C (in volts) | 170 | 250 | 240 | 260 |
| Average Increase in Forward Voltage Drop at 625 amps and 25°C | .03 | .19 | .03 | .19 |

In the case of 15/16 inch shield plate, it was observed that there was significantly better performance with the heavier irradiation. This could reasonably be attributed to scattering of the radiation to regions of the wafer under the mask. In the case of greater peripheral area exposure with the ⅞ inch shield, additional irradiation over $2 \times 10^{13}$ electrons/cm² does not significantly improve the performance of the process. These two observations suggest that the radiation has to approach to within 7/16 inch of the center of the device to effectively suppress amplification of the leakage current generated at the surface.

The increases in forward drop are rather more difficult to interpret. It would be expected to have less of an increase with the larger shield at a given at a given radiation level. However, it is suggested from the data that the increase in forward drop is due mostly to the scattering of the electrons by the silicon lattice into the bulk portion of the device. In other words, the increases in forward drop are not governed significantly by the exposure received by the silicon further than 7/16 inch from the center of the device.

While presently preferred embodiments have been shown and described with particularity, it is distinctly understood that the invention may be otherwise variously performed within the scope of the following claims.

What is claimed is:

1. A thyristor device comprising:

a. a silicon semiconductor body having a blocking PN junction therein; and b. a peripheral portion of the body having been irradiated with radiation means and a bulk portion of the body having been nonirradiated with said radiation means by masking said bulk portion against irradiation to increase the blocking voltage across the body without substantively increasing the forward voltage drop across the body.

2. A thyristor device as set forth in claim 1 wherein: the designed blocking voltage of the body is greater than 1,600 volts.

3. A method of increasing the blocking voltage of certain semiconductor devices without significantly increasing the forward voltage drop comprising the steps of:

a. masking bulk portions of the semiconductor device against radiation from a radiation source; and b. thereafter increasing the blocking voltage without significantly increasing the forward voltage drop by selectively irradiating peripheral portions of the semiconductor device with radiation from the radiation source.

4. The method of increasing the blocking voltage of certain semiconductor devices without significantly increasing the forward voltage drop as set forth in claim 1 wherein:

the radiation source is an electron beam.

5. The method of increasing the blocking voltage of certain semiconductor devices without significantly increasing the forward voltage drop as set forth in claim 2 wherein:

the irradiation of the peripheral portion of the semiconductor device with the electron beam is greater than about $1 \times 10^{13}$ electrons/cm².

6. The method of increasing the blocking voltage of certain semiconductor devices without significantly increasing the forward voltage drop as set forth in claim 3 wherein:

the electron beam has an intensity greater than about 1 Mev.

* * * * *

UNITED STATES PATENT OFFICE

CERTIFICATE OF CORRECTION

PATENT NO. : 3,872,493

DATED : March 18, 1975

INVENTOR(S) : John S. Roberts and Michael W. Cresswell

It is certified that error appears in the above-identified patent and that said Letters Patent are hereby corrected as shown below:

In claim 4, line 4, "1" should read -- 3 --.

In claim 5, line 4, "2" should read -- 4 --.

In claim 6, line 4, "3" should read -- 5 --.

Signed and Sealed this

*eleventh* Day of *May 1976*

[SEAL]

*Attest:*

RUTH C. MASON
*Attesting Officer*

C. MARSHALL DANN
*Commissioner of Patents and Trademarks*